US011644754B2

(12) United States Patent
Yoshida et al.

(10) Patent No.: US 11,644,754 B2
(45) Date of Patent: May 9, 2023

(54) PHOTOSENSITIVE SILOXANE COMPOSITION AND CURED FILM FORMED BY USING THE SAME

(71) Applicant: MERCK PATENT GMBH, Darmstadt (DE)

(72) Inventors: Naofumi Yoshida, Yokohama (JP); Megumi Takahashi, Kakegawa (JP); Katsuto Taniguchi, Kakegawa (JP); Toshiaki Nonaka, Tokyo (JP)

(73) Assignee: MERCK PATENT GMBH, Darmstadt (DE)

( * ) Notice: Subject to any disclaimer, the term of this patent is extended or adjusted under 35 U.S.C. 154(b) by 677 days.

(21) Appl. No.: 16/618,822

(22) PCT Filed: Jun. 4, 2018

(86) PCT No.: PCT/EP2018/064553
§ 371 (c)(1),
(2) Date: Dec. 3, 2019

(87) PCT Pub. No.: WO2018/224414
PCT Pub. Date: Dec. 13, 2018

(65) Prior Publication Data

US 2020/0089117 A1 Mar. 19, 2020

(30) Foreign Application Priority Data

Jun. 7, 2017 (JP) ............................ JP2017-112588

(51) Int. Cl.

| | |
|---|---|
| ***C08K 3/36*** | (2006.01) |
| ***G03F 7/075*** | (2006.01) |
| ***C08G 77/18*** | (2006.01) |
| ***C08K 7/26*** | (2006.01) |
| ***C08K 9/06*** | (2006.01) |
| ***C09D 183/04*** | (2006.01) |
| ***G03F 7/038*** | (2006.01) |
| ***G03F 7/039*** | (2006.01) |
| *C08G 77/00* | (2006.01) |

(52) U.S. Cl.
CPC ........... *G03F 7/0757* (2013.01); *C08G 77/18* (2013.01); *C08K 3/36* (2013.01); *C08K 7/26* (2013.01); *C08K 9/06* (2013.01); *C09D 183/04* (2013.01); *G03F 7/038* (2013.01); *G03F 7/039* (2013.01); *C08G 77/80* (2013.01); *C08K 2201/005* (2013.01); *C08K 2201/011* (2013.01)

(58) Field of Classification Search
CPC ........... C08K 3/36; C08K 9/06; C09D 183/04
See application file for complete search history.

(56) References Cited

U.S. PATENT DOCUMENTS

| | | | | |
|---|---|---|---|---|
| 2003/0157011 A1* | 8/2003 | Mori | C01B 33/158 | 106/482 |
| 2009/0105360 A1* | 4/2009 | Niwa | C09D 183/04 | 524/588 |
| 2012/0003436 A1 | 1/2012 | Saie et al. | | |
| 2013/0216952 A1 | 8/2013 | Yokoyama et al. | | |
| 2015/0291749 A1 | 10/2015 | Nonaka et al. | | |
| 2015/0293281 A1* | 10/2015 | Ezoe | C09D 7/45 | 359/359 |

FOREIGN PATENT DOCUMENTS

| | | | |
|---|---|---|---|
| CN | 101296999 | A | 10/2008 |
| CN | 103069341 | A | 4/2013 |
| CN | 103959168 | A | 7/2014 |
| EP | 1942150 | A1 | 7/2008 |
| EP | 2799928 | A1 | 11/2014 |
| EP | 2878607 | A1 | 6/2015 |
| JP | 2001-233611 | A | 8/2001 |
| JP | 2003-226516 | A | 8/2003 |
| JP | 2003-238140 | A | 8/2003 |
| JP | 2003-327424 | A | 11/2003 |
| JP | 2003-335515 | A | 11/2003 |
| JP | 2007182511 | A | 7/2007 |
| JP | 2013250504 | A | 12/2013 |
| TW | 201207560 | A | 2/2012 |
| WO | 2013/115367 | A1 | 8/2013 |
| WO | 2016/134820 | * | 1/2016 |

OTHER PUBLICATIONS

"Silane Coupling Agents" brochure, Shin Etsu, 2017.*
International Search Report for PCT/EP2018/064553 dated Sep. 14, 2018.
Written Opinion of the International Searching Authority for PCT/EP2018/064553 dated Sep. 14, 2018.
Chinese document by Scientific and Technical Documents Publishing House, published in Jan. 2006 , pp. 130-131.

* cited by examiner

*Primary Examiner* — Margaret G Moore
(74) *Attorney, Agent, or Firm* — Faegre Drinker Biddle & Reath LLP

(57) ABSTRACT

To provide a photosensitive composition capable of easily forming a cured film having a low refractive index. The present invention provides a photosensitive siloxane composition comprising: a polysiloxane, a photosensitive agent, hollow silica particles, and a solvent. The hollow silica particles contain voids inside, and have outer surfaces subjected to hydrophobic treatment.

19 Claims, No Drawings

PHOTOSENSITIVE SILOXANE COMPOSITION AND CURED FILM FORMED BY USING THE SAME

CROSS-REFERENCE TO RELATED APPLICATIONS

This application is a national stage application (under 35 U.S.C. § 371) of PCT/EP2018/064553, filed Jun. 4, 2018, which claims benefit of Japanese Application No. 2017-112588, filed Jun. 7, 2017, both of which are incorporated herein by reference in their entirety.

TECHNICAL FIELD

The present invention relates to a photosensitive siloxane composition. Further, this invention also relates to a cured film formed from the composition and to a device comprising the cured film.

BACKGROUND ART

In the field of displays or optical devices, there is often a problem in that visibility of displays and the like is impaired by external light reflected on the screen surfaces thereof. Accordingly, in order to reduce the reflection, it is necessary to coat the screen surfaces with a film having a low or high refractive index. For the purpose of meeting the necessity, development has been made on a low refractive index film whose refractive index is similar to that of air. However, it is often the case that large-scale apparatus, such as chemical deposition apparatus, must be used to produce the low refractive index film, and hence it is disadvantageous in terms of production cost. In view of that, it is desired to develop a material from which the low refractive index film can be easily formed by a simple wet-coating process.

There is a known method (Patent document 1) in which hollow silica particles are employed to form a film having a sufficiently low refractive index. The formed film contains voids provided by the hollow silica particles, so that the low refractive index is realized. However, silica particles generally have hydrophilic surfaces and accordingly have poor affinity with organic solvents. Because of that, conventional silica particle-containing compositions generally comprise hydrophilic solvents. On the other hand, however, for forming a patterned coating film, organic solvents are often adopted as a solvent. Accordingly, if a photosensitive composition contains hollow silica particles, the aging stability thereof may be so insufficient, for example, that the particles tend to form agglomeration.

For coping with the above problem, a method is proposed (Patent document 2). In the method, a photosensitive composition and hollow silica particles are separately prepared, then a layer of the photosensitive composition is formed, and thereafter the silica particles are implanted in the layer. However, the production process according to this method is complicated and, in addition, needs additional facilities and the like.

PRIOR ART DOCUMENTS

Patent Documents

[Patent document 1] Japanese Patent Laid-Open No. 2007-182511

[Patent document 2] Japanese Patent Laid-Open No. 2013-250504

DISCLOSURE OF INVENTION

Problem to be Solved by the Invention

The present invention aims to solve the above problem remaining to be improved in the prior art, and specifically aims to provide a photosensitive composition capable of easily forming a cured film of low refractive index.

Means for Solving Problem

The present invention provides a photosensitive siloxane composition comprising:

(I) a polysiloxane comprising a repeating unit represented by the following formula (Ia):

$$-\!\!\left[ O_{0.5} - \underset{\substack{| \\ O_{0.5} \\ \bot}}{\overset{R^1}{\overset{|}{Si}}} - O_{0.5} \right]\!\!- \tag{Ia}$$

in which $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$;

provided that in said aliphatic or aromatic hydrocarbon group, one or more methylene is substituted with oxy, imido or carbonyl, or unsubstituted, one or more hydrogen is substituted with fluorine, hydroxy or alkoxy, or unsubstituted, or and one or more one carbon is substituted with a silicon, or unsubstituted; and further provided that, if $R^1$ is a di- or trivalent group, $R^1$ links Si atoms contained in the plural repeating units;

(II) a photosensitive agent, (III) hydrophobic hollow silica particles which have structures comprising inside voids and silica layers enclosing said voids, and (IV) a solvent.

The present invention also provides a cured film formed from the above photosensitive siloxane composition.

The present invention further provides an electronic device comprising the above cured film.

Effect of the Invention

The photosensitive siloxane composition according to the present invention makes it possible to easily form a cured film having such a low refractive index as to serve suitably as a protective film or the like of an electronic device.

BEST MODE FOR CARRYING OUT THE INVENTION

Embodiments of the present invention will be explained below in detail.

Unless otherwise stated in the present specification, the numerical range shown by "A to B" includes the values A and B of both ends and they are expressed in terms of common units. For example, "5 to 25 mol %" means 5 mol % or more but 25 mol % or less.

Also in the present specification, "$C_{x\ to\ y}$", "$C_x$ to $C_y$" or "$C_x$" means the number of carbon atoms contained in the molecule or in the substituent. For example, "an alkyl group of $C_{1\ to\ 6}$" means an alkyl group having 1 or more but 6 or less carbon atoms (such as, methyl, ethyl, propyl, butyl, pentyl or hexyl). Further in the present specification, "a fluoroalkyl group" means an alkyl group in which one or more hydrogen is substituted with fluorine and "a fluoroaryl group" means an aryl group in which one or more hydrogen is substituted with fluorine.

Also, unless otherwise stated in the present specification, "an alkyl group" means a straight- or branched-chain alkyl group and "a cycloalkyl group" means an alkyl group having a cyclic structure. The "cycloalkyl group" includes an alkyl group having a cyclic structure which contains a straight- or branched-chain alkyl substituent. The term "hydrocarbon group" means a group containing monovalent, divalent or higher carbon and hydrogen and further, if necessary, oxygen or nitrogen. The term "aliphatic hydrocarbon group" means a straight, branched or cyclic aliphatic hydrocarbon group, and the "aromatic hydrocarbon group" means a group which contains an aromatic ring and may have, if necessary, an aliphatic hydrocarbon substituent. The aliphatic or aromatic hydrocarbon group may contain, if necessary, fluorine, oxy, hydroxy, amino, carbonyl or silyl group.

In the present specification, if a polymer comprises two or more kinds of repeating units, those repeating units are copolymerized. The copolymerization may be any of alternating copolymerization, random copolymerization, block copolymerization, graft copolymerization or mixture thereof unless otherwise stated.

Also, unless otherwise stated, the temperature in the present specification is represented by Celsius degrees. For example, "20° C." means the temperature of 20 Celsius degrees.

<Photosensitive Siloxane Composition>

The photosensitive siloxane composition according to the present invention comprises:
(I) a polysiloxane,
(II) a photosensitive agent,
(III) hydrophobic hollow silica particles,
(IV) a solvent, and
(V) an optional component.
Those components are individually described below.

[(I) Polysiloxane]

The term "polysiloxane" generally means a polymer having Si—O—Si bonds (siloxane bonds) as the main chain. In the present specification, the polysiloxane includes a silsesquioxane polymer represented by the formula $(RSiO_{1.5})_n$.

The polysiloxane according to the present invention comprises a repeating unit represented by the following formula (Ia):

(Ia)

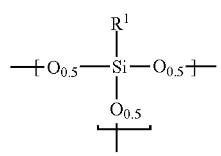

In the above formula, $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$. In the aliphatic or aromatic hydrocarbon group, at least one methylene is not substituted or oxy-, imido- or carbonyl-substituted, at least one hydrogen is not substituted or fluorine-, hydroxy- or alkoxy-substituted, or at least one carbon is not substituted or substituted with a silicon. If $R^1$ is a di- or trivalent group, $R^1$ links Si atoms contained in the plural repeating units.

Examples of a monovalent group adoptable as $R^1$ include: (i) an alkyl group, such as, methyl, ethyl, propyl, butyl, pentyl, hexyl, heptyl, octyl, or decyl; (ii) an aryl group, such as, phenyl, tolyl, or benzyl; (iii) a fluoroalkyl group, such as, trifluoromethyl, 2,2,2-trifluoroethyl, or 3,3,3-trifluoropropyl; (iv) a fluoroaryl group; (v) a cycloalkyl group, such as, cyclohexyl; (vi) a nitrogen-containing group having an amino or imido structure, such as, glycidyl, isocyanate or amino; and (vii) an oxygen-containing group having an epoxy (e.g., glycidyl), acryloyl or methacryloyl structure. Preferred are methyl, ethyl, propyl, butyl, pentyl, hexyl, phenyl, tolyl, glycidyl, and isocyanate. As the fluoroalkyl group, a pentafluoroalkyl group is preferred. Particularly preferred are trifluoromethyl and pentafluoroethyl. The compound in which $R^1$ is methyl is preferred because the starting materials thereof are easily available and further because the resultant cured film has high hardness and high chemical resistance. If $R^1$ is phenyl, the polysiloxane has such high solubility in the solvent that the resultant cured film hardly suffers from cracks. Accordingly, phenyl is also preferred. Further, $R^1$ preferably has hydroxy, glycidyl, isocyanate or amino because those groups improve adhesion between the cured film and the substrate.

Preferred examples of the di- or trivalent group adoptable as $R^1$ include: groups containing alkylene, arylene, cycloalkylene ring, piperidine ring, pyrrolidine ring or isocyanurate ring.

If necessary, the polysiloxane according to the present invention may further comprise a repeating unit represented by the following formula (Ib):

(Ib)

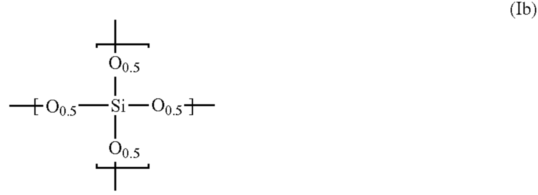

The above polysiloxane can be produced by hydrolyzing and condensing the silane compound represented by the following formula (ia), if necessary, in the presence of an acidic or basic catalyst.

$$R^1[Si(OR^2)_3]_p \quad \text{(ia).}$$

In the formula, p is 1 to 3; and $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$. In the aliphatic or aromatic hydrocarbon group, at least one methylene is not substituted or oxy-, imido- or carbonyl-substituted, at least one hydrogen is not substituted or fluorine-, hydroxy- or alkoxy-substituted, or at least one carbon is not substituted or substituted with a silicon.

Further, $R^2$ is an alkyl group of $C_{1\ to\ 10}$.

If the silane compound of the formula (ia) is adopted, the polysiloxane can be so produced as to consist of only the repeating unit of the formula (Ia). However, the compound of the formula (ia) can be used in combination with the silane compound represented by the following formula (ib) to produce another polysiloxane, which contains the repeating units of the formulas (Ia) and (Ib).

$$Si(OR^2)_4 \quad (ib)$$

Here, it is possible to employ two or more kinds of the silane compound (ia) in combination with two or more kinds of the silane compound (ib).

If the starting material mixture for producing the polysiloxane contains the silane compound (ib) in a large amount, it may be deposited or the formed coating film may deteriorate in photosensitivity. Accordingly, the blending ratio of the silane compound (ib) in the mixture is preferably 40 mol % or less, further preferably 20 mol % or less based on the total moles of the silane compounds used as the starting materials for producing the polysiloxane.

The polysiloxane normally has a weight average molecular weight of 500 to 25000 inclusive. However, in view of solubility in an organic solvent and in an alkali developer, the weight average molecular weight is preferably 1000 to 20000 inclusive. Here, the molecular weight is represented in terms of polystyrene reduced value and can be measured by gel permeation chromatography based on polystyrene.

It is for the purpose of forming a cured film that the composition of the present invention is applied to coat on a substrate, imagewise exposed to light and then developed. This means that there must be a difference in solubility between the exposed area and the unexposed area. Accordingly, the coating film of a positive type composition in the exposed area or that of a negative type one in the unexposed area should be soluble in a developer more than a certain degree. Specifically, if the coating film after prebaking has an alkali dissolution rate (hereinafter, often referred to as "ADR", described later in detail) of 50 Å/second or more in a 2.38 wt % aqueous solution of tetramethylammonium hydroxide (hereinafter, often referred to as "TMAH"), it seems to be possible to form a patterned cured film by exposure and development. However, the required solubility depends on the thickness of the formed film and on the development conditions, and hence the polysiloxane must be appropriately selected according to the development conditions. For example, if the coating film of a positive type composition has a thickness of 0.1 to 10 μm (1000 to 100000 Å), the alkali dissolution rate in a 2.38 wt % TMAH aqueous solution is preferably 50 to 5000 Å/second, more preferably 1000 to 3000 Å/second although it may vary according to the kind and the amount of the photosensitive agent incorporated in the composition. If the composition is of negative type, the alkali dissolution rate in a 2.38 wt % TMAH aqueous solution is preferably 50 to 20000 Å/second, more preferably 1000 to 10000 Å/second.

In the present invention, a polysiloxane having an ADR in the above ranges is selected to use according to the aimed application and the required properties. Further, it is possible to adopt two or more kinds of polysiloxanes having different ADRs in combination so as to obtain a desired ADR.

Polysiloxanes different in ADR or in average molecular weight can be produced by changing the conditions, such as, catalyst, reaction temperature, reaction time and polymer. If polysiloxanes different in ADR are employed in combination, it becomes possible to reduce pattern reflow and undissolved residues left after development and thereby to improve pattern stability.

The polysiloxane is, for example, (M): a polysiloxane which forms a film soluble in a 2.38 wt % TMAH aqueous solution at a dissolution rate of 200 to 3000 Å/second after prebaking.

If necessary, it may be mixed with (L): a polysiloxane which forms a film soluble in a 5 wt % TMAH aqueous solution at a dissolution rate of 1000 Å/second or less after prebaking, or (H): a polysiloxane which forms a film soluble in a 2.38 wt % TMAH aqueous solution at a dissolution rate of 4000 Å/second or more after prebaking, to prepare a composition having a desired dissolution rate.

The polysiloxanes (M), (H) and (L) individually have weight average molecular weights described above.

The polysiloxane adopted in the present invention has a branched structure because the compound (ia) or (ib) is employed as the starting material. If necessary, those starting materials can be used in combination with a two-functional silane compound so that the resultant polysiloxane may partly have a straight-chain structure. However, if high heat-resistance is necessary for use, the polysiloxane preferably contains a straight-chain structure in a small amount. Specifically, the straight-chain structure derived from the two-functional silane compound is contained preferably in an amount of 30 mol % or less based on the whole polysiloxane structure.

(Measurement and Calculation of Alkali Dissolution Rate (ADR))

The alkali dissolution rates given by the polysiloxanes and a mixture thereof are measured and calculated in the following manner, where a TMAH aqueous solution is adopted as an alkali solution.

First, the polysiloxane is diluted with propyleneglycol monomethyletheracetate (hereinafter, referred to as "PGMEA") to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and the wafer is spin-coated to form a coating film of 2±0.1 μm thickness. Thereafter, the coating film is heated for 90 seconds on a hot-plate at 100° C. to remove the solvent. The thickness of the coating film is then measured with a spectro-ellipsometer (manufactured by J.A. Woollam Co., Inc.)

Subsequently, the silicon wafer covered with the coating film is placed in a 6 inch-diameter glass petri dish filled with 100 ml of a TMAH aqueous solution of predetermined concentration at 23.0±0.1° C., and left to be immersed. The time it takes for the coating film to disappear is measured. The dissolution rate is obtained by dividing the initial thickness of the coating film by the time it takes for the coating film to dissolve and disappear in the area from the wafer edge to 10-mm inside. Otherwise, if the dissolution rate is extremely slow, the wafer is immersed in the TMAH aqueous solution for a predetermined time and then heated for 5 minutes on a hot-plate at 200° C. to remove water soaked in the coating film during the measurement of dissolution rate, and thereafter the thickness of the coating film is measured. The thickness change between before and after the immersion is divided by the immersing time to obtain the dissolution rate. The measurement is repeated five times and the obtained values are averaged to determine the dissolution rate of the polysiloxane.

[(II) Photosensitive Agent]

The photosensitive composition according to the present invention contains a photosensitive agent. Since the composition contains the photosensitive agent, it is possible to fabricate a patterned cured film by exposure and development and hence it is unnecessary to pattern the film by use of dry etching or the like. Accordingly, the composition of the present invention has the advantage of reducing damage to the circuit or the elements during a process of manufacturing a device. Depending on what photosensitive agent is adopted, the siloxane composition according to the present invention functions as either a positive or negative type photosensitive composition.

(II-1) Photosensitive Agent for Positive Type Photosensitive Composition

If the photosensitive agent works to make the composition of the present invention in the exposed area enough soluble to develop in an alkali developer and consequently to form a positive type pattern, the composition is of positive type.

The positive type photosensitive siloxane composition typically comprises a diazonaphthoquinone derivative. The diazonaphthoquinone derivative functioning as a photosensitive agent in the present invention is a compound in which a naphthoquinone diazide sulfonic acid is ester-bonded with a phenolic hydroxy-containing compound. There are no particular restrictions on the structure thereof, but the derivative is preferably an ester compound formed by esterification of a compound having one or more phenolic hydroxy groups. Examples of the naphthoquinone diazide sulfonic acid include: 4-naphthoquinone diazide sulfonic acid and 5-naphthoquinone diazide sulfonic acid. Because of having an absorption band in the i-line region (wavelength: 365 nm), 4-naphthoquinone diazide sulfonate is suitable for i-line exposure. On the other hand, 5-naphthoquinone diazide sulfonate is suitable for exposure in a wide wavelength range because absorbing light in a wide wavelength region. Accordingly, it is preferred to select 4-naphthoquinone diazide sulfonate or 5-naphthoquinone diazide sulfonate according to the exposure wavelength. It is also possible to use both 4-naphthoquinone diazide sulfonate and 5-naphthoquinone diazide sulfonate in a mixture.

There are no particular restrictions on the phenolic hydroxy-containing compound. Examples thereof include: bisphenol A, BisP-AF, BisOTBP-A, Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, and TrisP-TC ([trademark], manufactured by Honshu Chemical Industry Co., Ltd.).

The optimal amount of the diazonaphthoquinone derivative depends on the esterification ratio of naphthoquinone diazide sulfonic acid, on properties of the adopted polysiloxane, on the required photosensitivity and on the required dissolution contrast between the exposed and unexposed areas. However, it is preferably 3 to 20 weight parts, more preferably 5 to 15 weight parts, based on 100 weight parts of the polysiloxane. If the amount is 3 weight parts or more, the dissolution contrast between the exposed and unexposed areas is high enough to obtain favorable photosensitivity. For realizing more favorable dissolution contrast, the amount is preferably 5 weight parts or more. On the other hand, however, the less the diazonaphthoquinone derivative is contained, the more the resultant cured film is improved in colorless transparency and hence the higher transmittance the film has.

(II-2) Photosensitive Agent for Negative Type Photosensitive Composition

If the photosensitive agent works to make the composition of the present invention in the exposed area enough insoluble to develop in an alkali developer, the composition is of negative type. The photosensitive agent thus working is preferably, for example, a photo acid-generator, a photo base-generator, thermal acid-generator, thermal base-generator, photo thermal acid-generator or photo thermal base-generator.

The photo acid or base-generator is a compound generating acid or base, respectively, under light exposure, and is presumed to contribute toward polymerization of the polysiloxane. The thermal acid-generator or the thermal base-generator compounds generating acid or base by heating. The photo thermal acid-generator or photo thermal base-generator can be the compound which changes the chemical structure under exposure of light without generating acid or base, and then generate acid or base by bond cleavage caused by heating.

The amount of the photosensitive agent depends on the kind of the active substance released by decomposition thereof, on the amount of the released substance, on the required photosensitivity and on the required dissolution contrast between the exposed and unexposed areas. However, the amount is preferably 0.1 to 10 weight parts, more preferably 0.5 to 5 weight parts, based on 100 weight parts of the polysiloxane. From the viewpoint of promoting polymerization of the polysiloxane, the photosensitive agent is preferably incorporated in a large amount. On the other hand, from the viewpoint of avoiding cracks and coloring of the coating film, the amount thereof is preferably small.

The photo acid-generator can be freely selected from those generally used. Specifically, examples of the photo acid-generator include: diazomethane compounds, triazine compounds, sulfonic acid esters, diphenyliodonium salts, triphenylsulfonium salts, sulfonium salts, ammonium salts, phosphonium salts, and sulfonimide compounds.

Specific examples of the employable photo acid-generator include:

4-methoxyphenyldiphenylsulfonium hexafluorophosphonate,
4-methoxyphenyldiphenylsulfonium hexafluoroarsenate,
4-methoxyphenyldiphenylsulfonium methanesulfonate,
4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsente,
4-methoxyphenyldiphenylsulfonium-p-toluenesulfonate,
4-phenylthiophenyldiphenyl tetrafluoroborate,
4-phenylthiophenyldiphenyl hexafluorophosphonate, triphenylsulfonium methanesulfonate, triphenylsulfonium trifluoroacetate, triphenylsulfonium-p-toluenesulfonate,
4-methoxyphenyldiphenylsulfonium tetrafluoroborate,
4-phenylthiophenyldiphenyl hexafluoroarsenate,
4-phenylthiophenyldiphenyl-p-toluenesulfonate,
N-(trifluoromethylsulfonyloxy)succinimide,
N-(trifluoromethylsulfonyloxy)phthalimide,
5-norbornene-2,3-dicarboxyimidyl triflate,
5-norbornene-2,3-dicarboxyimidyl-p-toluenesulfonate,
4-phenylthiophenyldiphenyl trifluoromethanesulfonate,
4-phenylthiophenyldiphenyl trifluoroacetate,
N-(trifluoromethylsulfonyloxy)diphenylmaleimide,
N-(trifluoromethylsulfonyloxy)bicyclo[2.2,1]hept-5-ene-2,3-dicarboximide,
N-(trifluoromethylsulfonyloxy)naphthylimide, and
N-(nonaflurorobutylsulfonyloxy)naphthylimide.

Examples of the photo base-generator include: mufti-substituted amido compounds having amido groups, lactams, imido compounds, and compounds containing the structures thereof. Further, also usable are ion-type photo base-generators, which contain anions, such as, amide anion, methide anion, borate anion, phosphate anion, sulfonate anion and carboxylate anion.

Examples of the photo thermal base-generator represented by the following formula (PBG):

(PBG)

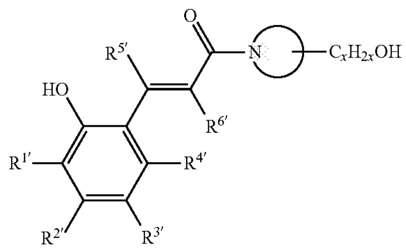

In the formula, x is an integer of 1 to 6 inclusive, and each of $R^{1'}$ to $R^{6'}$ is independently hydrogen, a halogen, hydroxy, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of $C_{1\ to\ 20}$ which may have a substituent, an aromatic hydrocarbon group of $C_{6\ to\ 22}$ which may have a substituent, an alkoxy group of $C_{1\ to\ 20}$ which may have a substituent, or an aryloxy group of $C_{6\ to\ 20}$ which may have a substituent.

Among the above, each of $R^{1'}$ to $R^{4'}$ is preferably independently hydrogen, hydroxy, an aliphatic hydrocarbon group of $C_{1\ to\ 6}$ or an alkoxy group of $C_{1\ to\ 6}$; and each of $R^{5'}$ and $R^{6'}$ is particularly preferably hydrogen.

Two or more of $R^{1'}$ to $R^{4'}$ may be linked to form a cyclic structure, and the cyclic structure may contain a hetero atom.

In the above formula, N is a constituting atom of a nitrogen-containing heterocyclic ring, which is a 3- to 10-membered ring. The nitrogen-containing heterocyclic ring may have one or more substituents different from $C_xH_{2x}OH$ shown in the formula (PBG), and may further have an aliphatic hydrocarbon group of $C_{1\ to\ 20}$, particularly of $C_{1\ to\ 6}$.

Each of $R^{1'}$ to $R^{4'}$ is preferably selected according to the employed exposure wavelength. For use in a display device, preferred are alkoxy groups, nitro group and unsaturated hydrocarbon-linking functional groups, such as vinyl and alkynyl. Those groups have a function of shifting the absorption wavelength to the g-, h- or i-line region. Among them, methoxy and ethoxy are particularly preferred.

Specific examples are as follows:

PBG-1

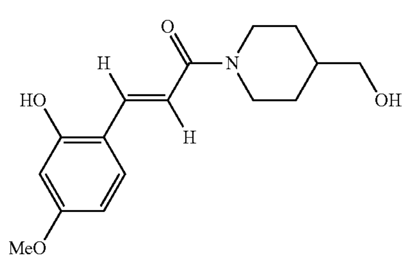

-continued

PBG-2

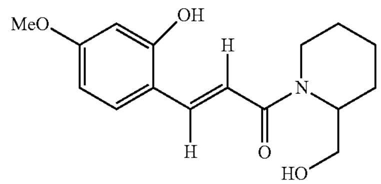

PBG-3

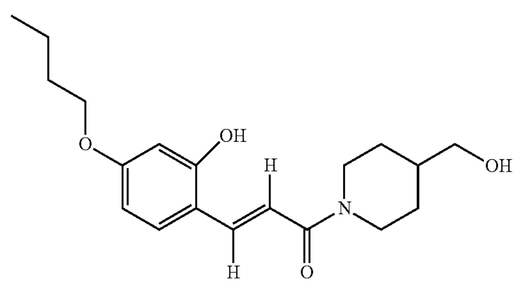

PBG-4

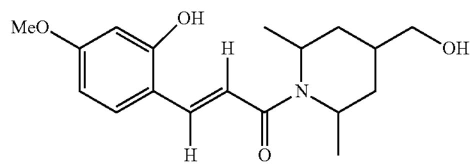

PBG-5

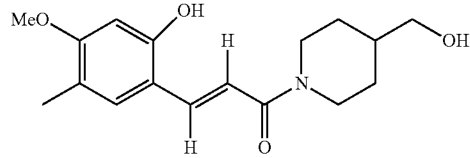

The photo thermal base-generator represented by the formula (PBG) is preferably used in the form of a hydrate or solvate. If the photo thermal base-generator is used in the form of an anhydrate, the effect often cannot be fully obtained. Here, the "anhydrate" means a compound that is neither hydrated nor solvated. There are no particular restrictions on how to hydrate or solvate an anhydrate of the photo thermal base-generator, and known methods can be adopted. For example, the photo thermal base-generator anhydrate is added to water or a solvent under the condition where the amount of water or solvent is 10 times or more the weight of the anhydrate, and then the solution is stirred for about 1 hour at room temperature or above. For forming the solvate, the solvent is preferably capable of both dissolving the photo thermal base-generator and being dissolved in water and also preferably has a boiling point lower than water. Examples of the solvent include THF and alcohols of $C_6$ or less. Subsequently, excess of the solvent is distilled off from the obtained mixture with an evaporator, to obtain the hydrate or solvate. It can be verified by infrared (IR) absorption spectroscopy, by $^1$H-NMR or by thermogravimetry differential thermal analysis (TG-DTA) whether or not the resultant product is hydrated or solvated.

In another way, the photo thermal base-generator in the form of an anhydrate may be mixed with water or solvent, stirred and then directly used without isolating the hydrate or solvate.

The amount of water for hydration or of solvent for solvation is 0.1 mol or more, preferably 1 mol or more based on 1 mol of the photo thermal base-generator represented by the formula (PBG).

[(III) Hydrophobic Hollow Silica Particles]

The composition according to the present invention contains hydrophobic hollow silica particles. The hollow silica particles adopted in the present invention are surface-treated to be hydrophobic. Each of the hydrophobic hollow silica particles (hereinafter, often simply referred to as "particles") comprises silica as a main component, and has a structure comprising an inside void and a silica layer enclosing the void. The shape of the particle can be likened to, for example, that of a ping-pong ball in which air is enclosed. The shell of the ball corresponds to the silica layer. However, the shape of the particle or inside void is not particularly restricted, and may be any shape, such as, spherical, substantially spherical, substantially ellipsoidal or cocoon shape. The silica layer may contain a component other than silica, but the content thereof is preferably small.

Hollow silica particles can be produced in any manner. For example, core fine particles comprising an alkali-soluble inorganic compound are dispersed in an aqueous solution, then silicon-containing layers are formed from silicic acid or silicates to coat the particle surfaces, and thereafter an acid or the like is added to remove the core fine particles. Some of the hollow silica particles thus produced may contain voids enclosed incompletely with the silica layers. This means that there may be such open holes penetrating through the silica layers that the inside voids connect to the outside. Even in that case, unless the inside voids in the particles are filled with other compounds or the like, they can function, without any problem, as the hollow silica particles in the present invention. Accordingly, the open holes preferably have small apertures. Commercially available hollow silica particles may contain a small number of particles having open holes or no voids, but they can achieve the effect of the present invention in most cases. Accordingly, after verified to be usable, they can be properly selected to use.

There are no particular restrictions on the size of the particles. The mean particle size is generally 30 to 200 nm, preferably 40 to 120 nm. Here, the mean particle size can be measured by means of a Nanotrac particle size distribution analyzer ([trademark], manufactured by NIKKISO Co., Ltd.) or the like according to dynamic light scattering (DLS).

In the present invention, the inside voids contained in the hollow silica particles are different from generally-known fine voids or gaps contained in porous silica particles. Specifically, each of the particles adopted in the present invention contains typically a single void or at most a few voids in a large volume ratio. As is understandable from the above-described process for producing the hollow silica particles, a single particle generally contains a single void. The volume ratio of the void to the particle is preferably as large as possible. However, in consideration of the void stability and the particle size, the void volume ratio is preferably 5 to 80%, more preferably 10 to 50% based on the particle volume. The mean diameter of the voids is preferably 3 to 180 nm, more preferably 10 to 100 nm. Here, the "mean diameter" means an equivalent volume diameter. The silica layer of each hollow silica particle may contain fine gaps or voids in itself.

The particles employed in the present invention are hydrophobic so that they can be stably dispersed in a solvent used for synthesis of the polysiloxane or used in the composition according to the present invention. In the present invention, the "hydrophobic treatment" means a treatment that enables the particles to disperse stably in an organic solvent used in the composition. Untreated silica particles are generally hydrophilic because they have silanol groups on their surfaces. Accordingly, if they are added to a photosensitive composition containing an organic solvent, the stability of the composition tends to deteriorate. In view of that, hydrophobic particles are adopted in the present invention to improve the stability. Hydrophobic hollow silica particles can be obtained by subjecting untreated ones to the hydrophobic treatment. The hydrophobic treatment can be carried out in any manner. For example, silanol groups on the particle surfaces are replaced with hydrophobic groups by use of a silane coupling agent represented by the following formula (S):

$$R^a{}_m Si(OR^b)_{4-m} \quad (S).$$

In the formula, $R^a$ is a mono- to trivalent saturated or unsaturated straight, branched or cyclic aliphatic hydrocarbon group of $C_{1\ to\ 20}$ or aromatic hydrocarbon group of $C_{6\ to\ 20}$. In the aliphatic or aromatic hydrocarbon group, at least one methylene is not substituted or oxy-, imido- or carbonyl-substituted, or at least one hydrogen is not substituted or fluorine-substituted. Further, if $R^a$ is a di- or trivalent group, $R^a$ links plural $Si(OR^b)$ groups. Examples of the monovalent $R^a$ include: methyl, ethyl, n-propyl, isopropyl, t-butyl, n-hexyl, n-decyl, trifluoromethyl, 2,2,2-trifluoroethyl, 3,3,3-trifluoropropyl, cyclohexyl, phenyl, tolyl, glycidyl, isocyanate and amino. Examples of the divalent or trivalent $R^a$ include: alkylene, arylene, cycloalkylene ring, piperidine ring, pyrrolidine ring or isocyanurate ring. In the formula, $R^b$ is a hydrogen or an alkyl group of $C_{1\ to\ 6}$; and m is 0 to 3.

The particle surfaces may be covered with an organic polymer so as to form hydrophobic outer surfaces. Examples of the organic polymer include: unsaturated hydrocarbon polymers, vinyl polymers, acrylic polymers, silicone polymers, siloxane polymers, polyesters, polyethers, polycarbonates, polyamides, polyurethanes, and copolymers thereof.

The silane coupling agent or organic polymer employed in the hydrophobic treatment preferably has a refractive index of 1.6 or less at 550 nm so that the resultant cured film may have a low refractive index.

The hydrophobic treatment with the silane coupling agent or organic polymer increases the content of organic components contained in the particles. Further, the silica layer may contain organic substances, such as, a binder. If the organic content is excessively increased, the resultant cured film may suffer from organic residues or defects caused by organic substances. In view of that, the content of silica is preferably 50 wt % or more, more preferably 70 wt % or more based on the total weight of the particles.

The addition amount of the hollow silica particles is controlled according to the aimed refractive index of the resultant cured film and the like. However, the volume ratio between the particles and the polysiloxane preferably satisfies the condition of: particles:polysiloxane=10:90 to 75:25, and the weight ratio therebetween preferably satisfies the condition of: particles:polysiloxane=10:90 to 70:30.

There are no particular restrictions on the dispersing agent as long as it can disperse the particles homogeneously. Examples thereof include: alcohols, such as, methanol, ethanol, isopropanol, and n-butanol; glycols, such as, ethylene glycol, and diacetone glycol; glycol ethers, such as, propyleneglycol monomethylether; glycol ether acetates, such as, PGMEA; ketones, such as, γ-butyrolactone, monomethyl ethyl ketone, 4-methyl-2-pentanone (MIBK); esters, such as, ethyl acetate; and aromatic hydrocarbons, such as, xylene and toluene.

Various kinds of hollow silica particles are commercially available, and they can be properly selected to use. Examples thereof include: SiliNax ([trademark], manufactured by Nittetsu Mining Co., Ltd.).

[(IV) Organic Solvent]

The composition according to the present invention contains an organic solvent, which is selected from solvents capable of evenly dissolving or dispersing the components in the composition. Examples of the organic solvent include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ether, such as, propylene glycol monomethyl ether (PGME) and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; and alcohols, such as, isopropanol, and propanediol. Those solvents can be used singly or in combination of two or more, and the amount thereof depends on the coating method and on the required thickness of the coating film. For example, in a spray coating process, the amount of the solvent is often 90 wt % or more based on the total weight of the polysiloxane and the optional components. However, when a slit-coating method is adopted in coating a large glass substrate for producing a display, the solvent amount is normally 50 wt % or more, preferably 60 wt % or more but normally 90 wt % or less, preferably 85 wt % or less.

[(V) Optional Component]

The composition of the present invention may contain other optional components, if necessary. Examples of the optional components include curing promoters. The photo acid- or base-generators, the photo thermal acid- or base-generators described above as a photosensitive agent for a negative type photosensitive composition can be also adopted as the curing promoters. They are selected according to polymerization reactions or crosslinking reactions conducted in the process for producing the cured film, and it is particularly preferred to incorporate them in a positive type composition. Here, the "photo" means, for example, visible light, UV rays or IR rays. The curing promoter is preferably a compound generating acid or base under exposure of UV rays employed for manufacturing thin film transistors.

The amount of the curing promoter depends on the kind of the active substance released by decomposition of the curing promoter, on the amount of the released substance, on the required photosensitivity and on the required dissolution contrast between the exposed and unexposed areas. However, the amount is preferably 0.001 to 10 weight parts, more preferably 0.01 to 5 weight parts, based on 100 weight parts of the polysiloxane. If the amount is 0.001 weight part or more, the dissolution contrast between the exposed and unexposed areas is high enough to obtain a favorable effect of the curing promoter. On the other hand, if it is 10 weight parts or less, the formed film hardly suffers from cracks and is not colored by decomposition of the curing promoter, so that the coating film is improved in colorless transparency.

The curing promoter may be a thermal acid-generator or a thermal base-generator. Examples of the thermal acid-generator include: various aliphatic sulfonic acids and salts thereof; various aliphatic carboxylic acids, such as, citric acid, acetic acid and maleic acid, and salts thereof; various aromatic carboxylic acids, such as, benzoic acid and phthalic acid, and salts thereof; aromatic sulfonic acids and ammonium salts thereof; various amine salts; aromatic diazonium salts; and phosphonic acid and salts thereof. Among those salts or esters capable of generating organic acids, salts of organic acids and organic bases are preferred, and further preferred are salts of sulfonic acids and organic bases.

Examples of the preferred sulfonic acids include: p-toluenesulfonic acid, benzenesulfonic acid, p-dodecylbenzenesulfonic acid, 1,4-naphthalenedisulfonic acid, and methanesulfonic acid. Those thermal acid-generators can be used singly or in mixture.

Examples of the thermal base-generator include: compounds generating bases, such as, imidazoles, tertiary amines, and quaternary ammoniums; and mixtures of those compounds. Examples of the generated bases include: imidazole derivatives, such as, N-(2-nitrobenzyloxycarbonyl)imidazole, N-(3-nitrobenzyloxycarbonyl)imidazole, N-(4-nitrobenzyloxycarbonyl)imidazole, N-(5-methyl-2-nitrobenzyloxycarbonyl)irnidazole, and N-(4-chloro-2-nitrobenzyloxycarbonyl)imidazole; and 1,8-diazabicyclo[5,4,0]undecene-7. Those base-generators as well as the acid-generators can be used singly or in mixture.

Examples of the optional components also include surfactants.

The composition according to the present invention preferably contains a surfactant because the surfactant improves coating properties. The surfactants usable in the composition of the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene alcohol derivatives, such as, polyethoxyate of acetylene alcohol; acetylene glycols; acetylene glycol derivatives such as polyethoxyate of acetylene glycol; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 10000 ppm, preferably 100 to 5000 ppm based on the total weight of the photosensitive siloxane composition.

<Cured Film and Electronic Device Comprising the Cured Film>

The cured film according to the present invention can be produced by coating a substrate with the above-described photosensitive siloxane composition and then curing the formed coating film.

The coating film can be formed from the composition of the present invention by a known coating method, such as, immersion coating, roll coating, bar coating, brush coating, spray coating, doctor coating, flow coating, spin coating, or slit coating. Those are conventionally known as methods for applying a photosensitive siloxane composition. The substrate can be also appropriately selected from, for example, a silicon substrate, a glass substrate or a resin film. If the substrate is in the form of a film, gravure coating can be carried out. If desired, a drying step can be independently carried out after coating. Further, according to necessity, the coating step may be repeatedly carried out once or twice or more so as to form a coating film of desired thickness.

After formed from the photosensitive siloxane composition of the present invention, the coating film is preferably subjected to prebaking (preheating treatment) for the purposes of drying the film and of reducing the solvent remaining therein. The prebaking step is carried out at a temperature of generally 70 to 150° C., preferably 90 to 120° C. for 10 to 180 seconds, preferably 30 to 90 seconds on a hot-plate or for 1 to 30 minutes in a clean oven.

Since the composition of the present invention is photosensitive, it can form a patterned cured film. The method for forming a pattern is explained below. In order to form a desired pattern, a coating film is formed from the composition of the present invention, then prebaked, and subsequently pattern-wise exposed to light. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. Energy of the exposure light depends on the light source and the initial thickness of the coating film, but is generally 10 to 2000 $mJ/cm^2$, preferably 20 to 1000 $mJ/cm^2$. If the exposure energy is lower than 10 $mJ/cm^2$, the composition decomposes insufficiently. On the other hand, if it is more than 2000 $mJ/cm^2$, the coating film is exposed so excessively that the exposure may cause halation.

In order that the coating film can be pattern-wise exposed to light, common photomasks are employable. Those photomasks are known to those skilled in the art. The exposure can be carried out under an ambient atmosphere (the normal atmosphere) or under a nitrogen atmosphere. If the cured film is intended to be formed on the whole surface of the substrate, the whole film surface is exposed to light. In the present invention, the term “pattern film” includes a film thus formed on the whole surface of the substrate.

After the exposing step, post-exposure baking can be carried out according to necessity with the aim of promoting interpolymer reactions by the acid or base generated in the exposed area of the film of, particularly, a negative type composition. This heating treatment differs from the below-described heating step in that it is not for the purpose of curing the coating film completely but for the purpose of making it possible to leave a desired pattern on the substrate after development and to remove the part other than the pattern by development.

When the post-exposure baking step is carried out, it is possible to use a hot-plate, an oven, a furnace or the like. The heating temperature should not be too high because it is unfavorable for the acid or base generated by exposure in the exposed area to diffuse into the unexposed area. In view of that, the temperature of post-exposure baking is preferably 40 to 150° C., more preferably 60 to 120° C. If necessary, the temperature may be step-by-step increased so as to control the curing speed of the composition. There are no particular restrictions on the atmosphere of baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere or the like. The baking time is preferably longer than a certain period so as to keep higher uniformity of thermal budget in the wafer surface, but also preferably not excessively long so as to prevent the diffusion of acid. In consideration of those, the baking time is preferably 20 to 500 seconds, more preferably 40 to 300 seconds.

As a developer used in the development step, it is possible to adopt any conventional developer employed in developing photosensitive siloxane compositions. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), ammonia, alkylamine, alkanolamine, or heterocyclic amine. A particularly preferred alkali developer is an aqueous solution of tetraalkylammonium hydroxide. Those alkali developers may further contain surfactants or water-soluble organic solvents, such as, methanol and ethanol, if necessary. After developed with an alkali developer, the film is normally rinsed with water.

Subsequently, the film is normally subjected to entire surface exposure (flood exposure). In the entire surface exposure, the photo acid- or base-generator receives radiated light and releases acid or base, respectively. If the photo thermal acid- or the photo thermal base-generator is utilized, it receives light and changes the chemical structure. When a positive type pattern is intended to be formed, the exposure light photo-decomposes unreacted molecules of the diazonaphthoquinone derivative remaining in the film, and thereby improves light-transparency of the film. Accordingly, if transparency is required, the film is preferably subjected to entire surface exposure. For example, the whole film surface is exposed to light at an exposure dose of 100 to 2000 $mJ/cm^2$ (in terms of reduced amount of exposure at 365 nm) by use of a UV-visible exposure unit, such as, an aligner (PLA-501F [trademark], manufactured by Canon Inc.).

After developed, the pattern film is heated to cure. The heating temperature is not particularly restricted as long as the film can be cured, but normally 150 to 400° C., preferably 200 to 350° C. If it is lower than 150° C., the silanol groups tend to remain unreacted. The silanol groups generally have such polarity as to often induce high permittivity, and hence the film is preferably cured at a temperature of 200° C. or above if the permittivity is intended to be lowered.

The cured film according to the present invention characteristically has a low refractive index. Specifically, the refractive index thereof is preferably 1.45 or less at 550 nm.

The cured film thus produced can be advantageously used for various applications. For example, it can be adopted as a planarization film, an interlayer insulating film or a transparent protective film employed in various devices such as flat panel displays (FPDs), and also is employable as an interlayer insulating film for low temperature polysilicon or as a buffer coating film for IC chips. Further, the cured product can be used as an optical device element.

EXAMPLES

The present invention will be further specifically explained by use of the following examples.

Synthesis Example (Synthesis of Polysiloxane (P1))

In a 2-L flask equipped with a stirrer, a thermometer and a condenser, 24.5 g of a 25 wt % aqueous solution of tetramethylammonium hydroxide (TMAH), 300 ml of isopropyl alcohol (IPA) and 2.0 g of water were placed. Independently, 34.0 g (50 mol %) of methyltrimethoxysilane, 39.7 g (40 mol %) of phenyltrimethoxysilane and 7.6 g (10 mol %) of tetramethoxysilane were mixed to prepare a mixed solution, which was then placed in a dropping funnel. The mixed solution was dropped into the flask at 60° C., and successively the obtained mixture was stirred at the same temperature for 3 hours. Subsequently, 10% HCl aqueous solution was added to neutralize the mixture, and then 200 ml of toluene and 300 ml of water were added into the neutralized mixture, so that the mixture was separated into two layers. The organic layer was collected and condensed under reduced pressure to remove the solvent. To the obtained concentrate, PGMEA was added so that the solid content might be 40 wt %. The molecular weight (in terms of polystyrene reduced value) of the obtained polysiloxane (P1) was measured to find the weight average molecular weight (Mw)=1800. Further, a silicon wafer was coated with the obtained resin solution so that the formed film might have a thickness of 2 μm after prebaking. Thereafter, the dissolution rate in a 2.38 wt % TMAH aqueous solution was measured and found to be 1200 Å/second.

Preparation Example 1 (Hollow Silica Particles Treated to be Hydrophobic)

Hollow silica particles were prepared according to Japanese Patent No. 5378771.

Silica-alumina sol (USBB-120 ([trademark], manufactured by JGC Catalysts and Chemicals Ltd.; mean particle size: 25 nm, $SiO_2$—$Al_2O_3$ content: 20 wt %, $Al_2O_3$ in solid content: 27 wt %) in an amount of 100 g was added to 3900 g of pure water. While the mixture was kept at 98° C., 1750 g of aqueous solution of sodium silicate ($SiO_2$-reduced concentration: 1.5 wt %) and 1750 g of aqueous solution of sodium aluminate ($Al_2O_3$-reduced concentration: 0.5 wt %) were added therein to obtain a dispersion of $SiO_2$—$Al_2O_3$ primary particles (mean particle size: 35 nm).

Subsequently, 6300 g of aqueous solution of sodium silicate ($SiO_2$-reduced concentration: 1.5 wt %) and 2100 g of aqueous solution of sodium aluminate ($Al_2O_3$-reduced concentration: 0.5 wt %) were further added to obtain a dispersion of complex oxide fine particles (secondary particles) (mean particle size: 50 nm).

The obtained dispersion of complex oxide fine particles was washed by use of an ultrafiltration membrane so that the solid content might be 13 wt %. After 1125 g of pure water was then added to 500 g of the dispersion, concentrated hydrochloric acid (concentration: 35.5 wt %) was further dropped therein and thereby the pH value was set at 1.0 so as to conduct dealumination treatment. Thereafter, while 10 L of a hydrochloric acid aqueous solution of pH 3 and 5 L of pure water were kept being added, the dissolved aluminum salt was separated and washed by use of an ultrafiltration membrane to obtain an aqueous dispersion (solid content: 20 wt %) of hollow silica particles.

The obtained aqueous dispersion of hollow silica particles, pure water, ethanol and a 28 wt % ammonia aqueous solution in amounts of 150 g, 500 g, 1750 g and 626 g, respectively, were mixed and heated at 35° C., and then 80 g of ethyl silicate ($SiO_2$-reduced concentration: 28 wt %) was added therein to form silica-coating layers on the particles. While 5 L of pure water was kept being added, the obtained dispersion was washed by use of an ultrafiltration membrane to obtain an aqueous dispersion (solid content: 20 wt %) of hollow silica particles coated with the silica-coating layers.

After the pH value of the obtained dispersion was adjusted to 10.5 with an ammonia aqueous solution, the dispersion was left for 11 hours at 200° C. The dispersion was then cooled to room temperature, and repeatedly purified with a cation-exchange resin (DIAION SK1B [trademark], manufactured by Mitsubishi Chemical Corporation) and an anion-exchange resin (DIAION SA20A [trademark], manufactured by Mitsubishi Chemical Corporation) to obtain an aqueous dispersion (solid content: 20 wt %) of hollow silica particles. The obtained aqueous dispersion was found to contain $Na_2O$ and $NH_3$ in amounts of 0.4 ppm and 60 ppm, respectively, per silica particle.

Subsequently, the solvent of the dispersion was replaced with ethanol by use of an ultrafiltration membrane to obtain an ethanol dispersion (solid content: 20 wt %) of hollow silica particles. To 100 g of the ethanol dispersion, 3 g of an acrylic silane coupling agent (γ-acryloxypropyltrimethoxysilane) (KBM-5103 [trademark], manufactured by Shin-Etsu Chemical Co., Ltd.) was added and then subjected to heat treatment at 50° C. Thereafter, the solvent of the dispersion was again replaced with ethanol by use of an ultrafiltration membrane to obtain an ethanol dispersion (solid content: 20 wt %) of hollow silica particles.

Preparation Example 2 (Hollow Silica Particles Treated to be Hydrophobic)

The procedure of Preparation example 1 was repeated except for changing the acrylic silane coupling agent into trirnethoxypropylsilane, to prepare silica particles.

Preparation Example 3 (Hollow Silica Particles not Treated to be Hydrophobic)

The procedure of Preparation example 1 was repeated except that the dispersion was not treated with the acrylic silane coupling agent, to prepare silica particles.

Preparation Example 4 (Hydrophobization of Solid Silica Particles)

Silica sol (Klebosol 20H12 [trademark], manufactured by Merck KGaA), in which silica particles contain no inside voids, was subjected to dispersion medium replacement. The medium of the sol dispersion was changed from water to PGME in the same concentration. In a three-neck flask, 30 g of the PGME-substituted Klebosol 20H12 and 0.15 g of water were placed. While the mixture was kept heated at 60° C., 6 g of trimethoxypropylsilane ($C_3H_7Si(OMe)_3$) was dropped therein and made to react for 4 hours. The resultant liquid was concentrated with an evaporator, to complete hydrophobization.

Examples 1 to 5 and Comparative Examples 1 to 4

Various additives were combined to prepare siloxane compositions of Examples 1 to 5 and Comparative examples 1 to 4. The components of each composition are shown in Table 1. In the table, the amounts of polysiloxane, silica particles, photosensitive agents and curing promoters are shown in terms of weight parts.

The additives are as follows:

Silica Particles S1:

silica particles in Preparation example 1 (mean particle size: 60 nm, mean void diameter: 30 nm), Silica Particles S2:

silica particles in Preparation example 2 (mean particle size: 60 nm, mean void diameter: 30 nm), Silica Particles S3:

silica particles not treated to be hydrophobic in Preparation example 3 (mean particle size: 60 nm, mean void diameter: 30 nm), Silica Particles S4:

silica particles containing no voids and treated to be hydrophobic in Preparation example 4 (mean particle size: 30 nm), Photosensitive Agent for Positive Type Composition:

4,4'-(1-(4-(1-(4-hydroxyphenol)-1-methylethyl)-phenyl)-ethylidene)bisphenol modified with 2.0 mol of diazonaphthoquinone, Photosensitive Agent for Negative Type Composition*:

1,8-naphthalimidyl triflate (NAI-105 [trademark], manufactured by Midori Kagaku Co., Ltd.)

[*: 1,8-naphthalimidyl triflate serves as a curing promoter when added to a positive type composition], and Surfactant:

KF-53 ([trademark], manufactured by Shin-Etsu Chemical Co., Ltd.).

Examples 1 to 4 and Comparative Examples 1 to 3

A 4-inch silicon wafer was spin-coated with each composition to form a coating film of 2.5 μm thickness. The obtained film was prebaked for 90 seconds at 100° C. to evaporate the solvent. The dried film was then subjected to pattern-exposure at 100 to 200 mJ/cm$^2$ by use of a g+h+i line mask aligner (PLA-501F [trademark], manufactured by Canon Inc.), thereafter subjected to paddle development for 60 seconds with a 2.38 wt % TMAH aqueous solution, and finally rinsed with pure water for 60 seconds. Further, the film was subjected to flood exposure at 1000 mJ/cm$^2$ by use of the g+h+i line mask aligner, and then heated to cure at 230° C. for 30 minutes.

Example 5 and Comparative Example 4

A 4-inch silicon wafer was spin-coated with each composition to form a coating film of 2.5 μm thickness. The obtained film was prebaked for 90 seconds at 100° C. to evaporate the solvent. The dried film was then subjected to pattern-exposure at 20 to 50 mJ/cm$^2$ by use of a g+h+i line mask aligner (PLA-501F [trademark], manufactured by Canon Inc.), subsequently baked for 90 seconds at 100° C. to promote the reaction, thereafter subjected to paddle development for 60 seconds with a 2.38 wt % TMAH aqueous solution, and finally rinsed with pure water for 60 seconds. Further, the film was subjected to flood exposure at 1000 mJ/cm$^2$ by use of the g+h+i line mask aligner, and then heated to cure at 230° C. for 30 minutes.

The refractive indexes of the cured films thus obtained were individually measured at 550 nm with an ellipsometer (M-2000 [trademark], manufactured by J.A. Woollam Co., Inc.). The results are shown in Table 1.

TABLE 1

| | | | | | | positive type | | negative type | | | | |
|---|---|---|---|---|---|---|---|---|---|---|---|---|
| | polysiloxane | silica particles | | | | photo-sensitive | curing | photo-sensitive | | surfactant | refractive index | |
| | P1 | S1 | S2 | S3 | S4 | agent | aid | agent | solvent | (ppm) | 550 nm | pattern |
| Ex. 1 | 75 | 25 | — | — | — | 6 | 1 | — | PGMEA:PGME = 50:50 | 1000 | 1.45 | ○ |
| Ex. 2 | 60 | 40 | — | — | — | 6 | 1 | — | PGMEA:PGME = 50:50 | 1000 | 1.40 | ○ |
| Ex. 3 | 40 | 60 | — | — | — | 6 | 1 | — | PGMEA:PGME = 50:50 | 1000 | 1.35 | ○ |
| Ex. 4 | 75 | — | 25 | — | — | 6 | 1 | — | PGMEA:PGME = 50:50 | 1000 | 1.44 | ○ |
| Com. 1 | 100 | — | — | — | — | 6 | 1 | — | PGMEA | 1000 | 1.51 | ○ |
| Com. 2 | 75 | — | — | 25 | — | 6 | 1 | — | PGMEA:PGME = 50:50 | 1000 | x | x |
| Com. 3 | 75 | — | — | — | 25 | 6 | 1 | — | PGMEA:PGME = 50:50 | 1000 | 1.49 | ○ |
| Ex. 5 | 75 | 25 | — | — | — | — | — | 1 | PGMEA:PGME = 50:50 | 1000 | 1.44 | ○ |
| Com. 4 | 100 | — | — | — | — | — | — | 1 | PGMEA | 1000 | 1.50 | ○ |

From the obtained results, the composition according to the present invention was verified to make it possible to form a silicious film having a low refractive index. The composition of Comparative example 2 had such poor dispersion stability that the prebaked coating film was clouded, and hence could not form a pattern even when subjected to pattern-exposure. In contrast, all the compositions according to the present invention successfully formed patterns excellent in reproducibility.

The invention claimed is:

1. A photosensitive siloxane composition, comprising:

(I) a polysiloxane comprising a repeating unit represented by the following formula (Ia):

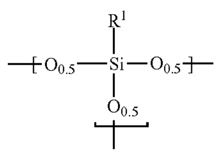

(Ia)

in which $R_1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$;

provided that, in said aliphatic or aromatic hydrocarbon group, one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted; and further provided that, if $R^1$ is a di- or trivalent group, $R^1$ links Si atoms contained in the plural repeating units;

(II) a photosensitive agent, (III) hydrophobic hollow silica particles which have structures comprising inside voids and silica layers enclosing said voids, said silica layer comprising an organic substance, and said hydrophobic hollow silica particles have a mean particle size of 30 to 200 nm, and (IV) a solvent.

2. The composition according to claim 1, wherein said polysiloxane further comprises a repeating unit represented by the following formula (Ib):

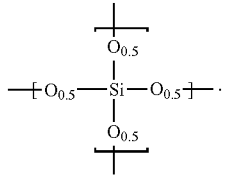

(Ib)

3. The composition according to claim 1; wherein said polysiloxane forms, after prebaking, a film having a dissolution rate of 50 to 5000 Å/second in a 2.38 wt % aqueous solution of tetramethylammonium hydroxide, so as to function as a positive type photosensitive composition.

4. The composition according to claim 1; wherein said polysiloxane forms, after prebaking, a film having a dissolution rate of 50 to 20000 Å/second in a 2.38 wt % aqueous solution of tetramethylammonium hydroxide, so as to function as a negative type photosensitive composition.

5. The composition according to claim 1, wherein said hydrophobic hollow silica particles are obtained by subjecting untreated hollow silica particles to hydrophobic treatment with a silane coupling agent having a refractive index of 1.6 or less at 550 nm or otherwise by coating the untreated hollow silica particles with an organic polymer having a refractive index of 1.6 or less at 550 nm.

6. The composition according to claim 1, wherein said voids have a mean diameter of 3 to 180 nm.

7. The composition according to claim 1, wherein the volume ratio of said voids to said hydrophobic hollow silica particles is 5 to 80% inclusive.

8. The composition according to claim 1, wherein the volume ratio between said hydrophobic hollow silica particles and said polysiloxane satisfies the condition of:

hydrophobic hollow silica particles: polysiloxane =10:90 to 75:25.

9. A cured film formed from the photosensitive siloxane composition according to claim 1.

10. The cured film according to claim 9, having a refractive index of 1.45 or less at a wavelength of 550 nm.

11. An electronic device comprising the cured film according to claim 9.

12. A photosensitive siloxane composition, comprising:

(I) a polysiloxane comprising a repeating unit represented by the following formula (Ia):

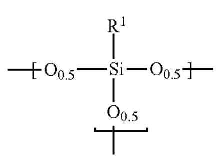

(Ia)

in which $R^1$ is hydrogen, a mono- to trivalent saturated or unsaturated straight, branched or cyclic aliphatic hydrocarbon group of $C_{1\ to\ 30}$, or a mono- to trivalent aromatic hydrocarbon group of $C_{6\ to\ 30}$;

provided that, in said aliphatic or aromatic hydrocarbon group, one or more methylene is substituted with oxy, imido or carbonyl, or unsubstituted, one or more hydrogen is substituted with fluorine, hydroxy or alkoxy, or unsubstituted, and one or more carbon is substituted with a silicon, or unsubstituted; and further provided that, if $R^1$ is a di- or trivalent group, $R^1$ links Si atoms contained in the plural repeating units;

(II) a photosensitive agent, (III) hydrophobic hollow silica particles which have structures comprising inside voids and silica layers enclosing said voids, said silica layer comprising a binder, and said hydrophobic hollow silica particles have a mean particle size of 30 to 200 nm, and (IV) a solvent.

13. The composition according to claim 12, wherein said polysiloxane further comprises a repeating unit represented by the following formula (Ib):

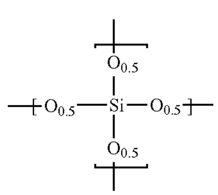

(Ib)

14. The composition according to claim 12; wherein said polysiloxane forms, after prebaking, a film having a dissolution rate of 50 to 5000 Å/second in a 2.38 wt % aqueous solution of tetramethylammonium hydroxide, so as to function as a positive type photosensitive composition.

15. The composition according to claim 12; wherein said polysiloxane forms, after prebaking, a film having a dissolution rate of 50 to 20000 Å/second in a 2.38 wt % aqueous solution of tetramethylammonium hydroxide, so as to function as a negative type photosensitive composition.

16. The composition according to claim 12, wherein said hydrophobic hollow silica particles are obtained by subjecting untreated hollow silica particles to hydrophobic treatment with a silane coupling agent having a refractive index of 1.6 or less at 550 nm or otherwise by coating the untreated hollow silica particles with an organic polymer having a refractive index of 1.6 or less at 550 nm.

17. The composition according to claim 12, wherein said voids have a mean diameter of 3 to 180 nm.

18. The composition according to claim 12, wherein the volume ratio of said voids to said hydrophobic hollow silica particles is 5 to 80% inclusive.

19. The composition according to claim 12, wherein the volume ratio between said hydrophobic hollow silica particles and said polysiloxane satisfies the condition of:

hydrophobic hollow silica particles:polysiloxane =10:90 to 75:25.

* * * * *